United States Patent [19]

Egle et al.

[11] Patent Number: 4,812,652

[45] Date of Patent: Mar. 14, 1989

[54] IMAGING METHOD AND APPARATUS FOR ELECTRON MICROSCOPES

[75] Inventors: Wilhelm Egle, Aalen, Fed. Rep. of Germany; F. Peter Ottensmeyer, Don Mills, Canada; Albrecht Rilk, Königsbronn, Fed. Rep. of Germany

[73] Assignee: Carl-Zeiss Stiftung, Heidenheim, Fed. Rep. of Germany

[21] Appl. No.: 40,533

[22] Filed: Apr. 17, 1987

Related U.S. Application Data

[63] Continuation of Ser. No. 743,479, Jun. 11, 1985.

[30] Foreign Application Priority Data

Jun. 22, 1984 [DE] Fed. Rep. of Germany ....... 3423149

[51] Int. Cl.$^4$ .............................................. H01J 37/26
[52] U.S. Cl. .................................... 250/311; 250/305; 250/396 ML; 250/396 R
[58] Field of Search ........ 250/311, 305, 396, 396 ML, 250/505.1

[56] References Cited

U.S. PATENT DOCUMENTS 3,715,582  2/1973  Akahori et al. .................... 250/311
3,979,590  9/1976  Andersen ............................ 250/305
4,048,498  9/1977  Gerlach et al. ..................... 250/305

OTHER PUBLICATIONS

Egerton et al., Journal of Physics E, vol. 8, No. 12, Dec. 1975, pp. 1033–1037.

Egerton, Optik, vol. 57, No. 2, 1980, pp. 220–242.

Primary Examiner—Bruce C. Anderson
Assistant Examiner—Jack I. Berman

[57] ABSTRACT

A transmission electron microscope is disclosed, having an electron-energy spectrometer, a first imaging stage of four electron lenses in front of the spectrometer, and a second imaging stage of two more electron lenses following the spectrometer. The parts are so arranged, according to the disclosed structure, and so operated, according to the disclosed method, that a large range of magnifications can be obtained while the object or specimen to be examined remains in a fixed location, without having to refocus when the magnification is changed. The change in magnification occurs by changing the operation of the first imaging stage. The second imaging stage operates at a substantially fixed magnification, its magnification being changed, if at all, only to accommodate the size of the output image from the second stage to size of the available working area of the detector in the final image plane (fluorescent screen, photographic film, or electronic detector). The first stage, at all magnifications, always images the object or an image of a diffraction pattern of the object into the input image plane of the spectrometer and an image of the electron source into the input crossover plane of the spectrometer. The spectrometer is of the prism-mirror-prism type, and improved results are obtained by making the entrance and exit surfaces of the prism curved rather than planar.

30 Claims, 6 Drawing Sheets

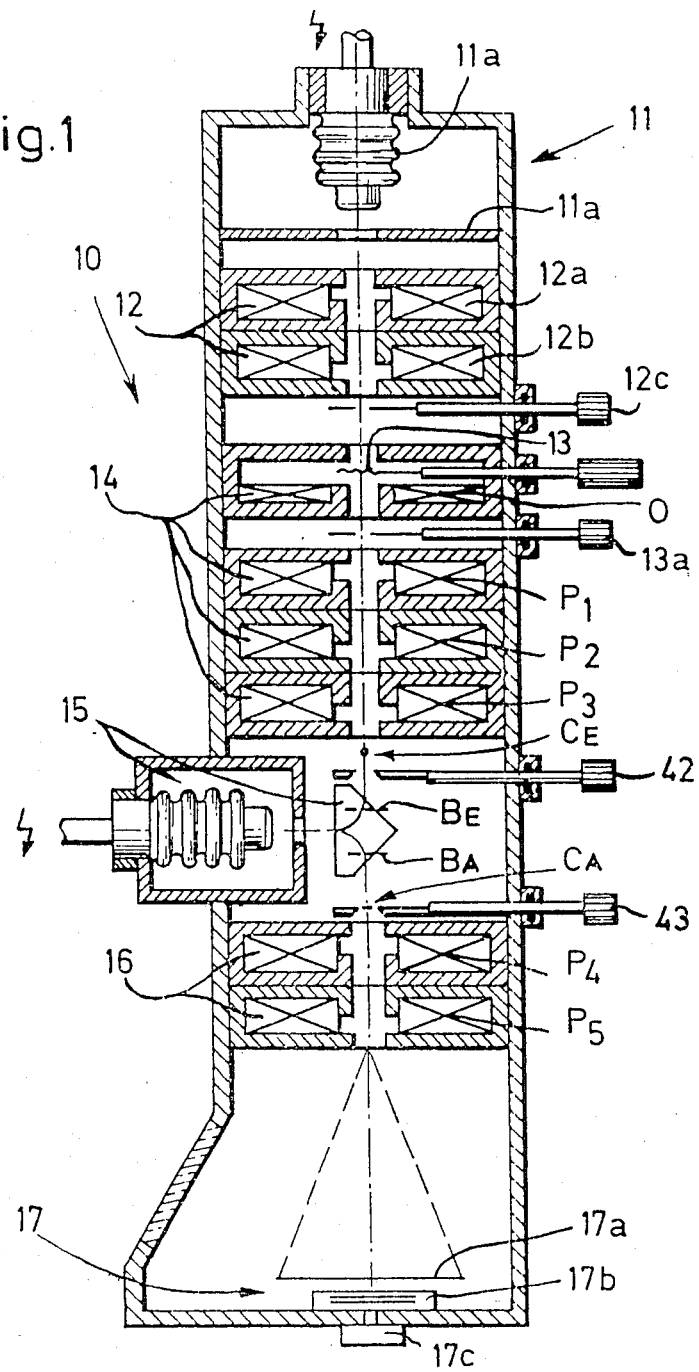

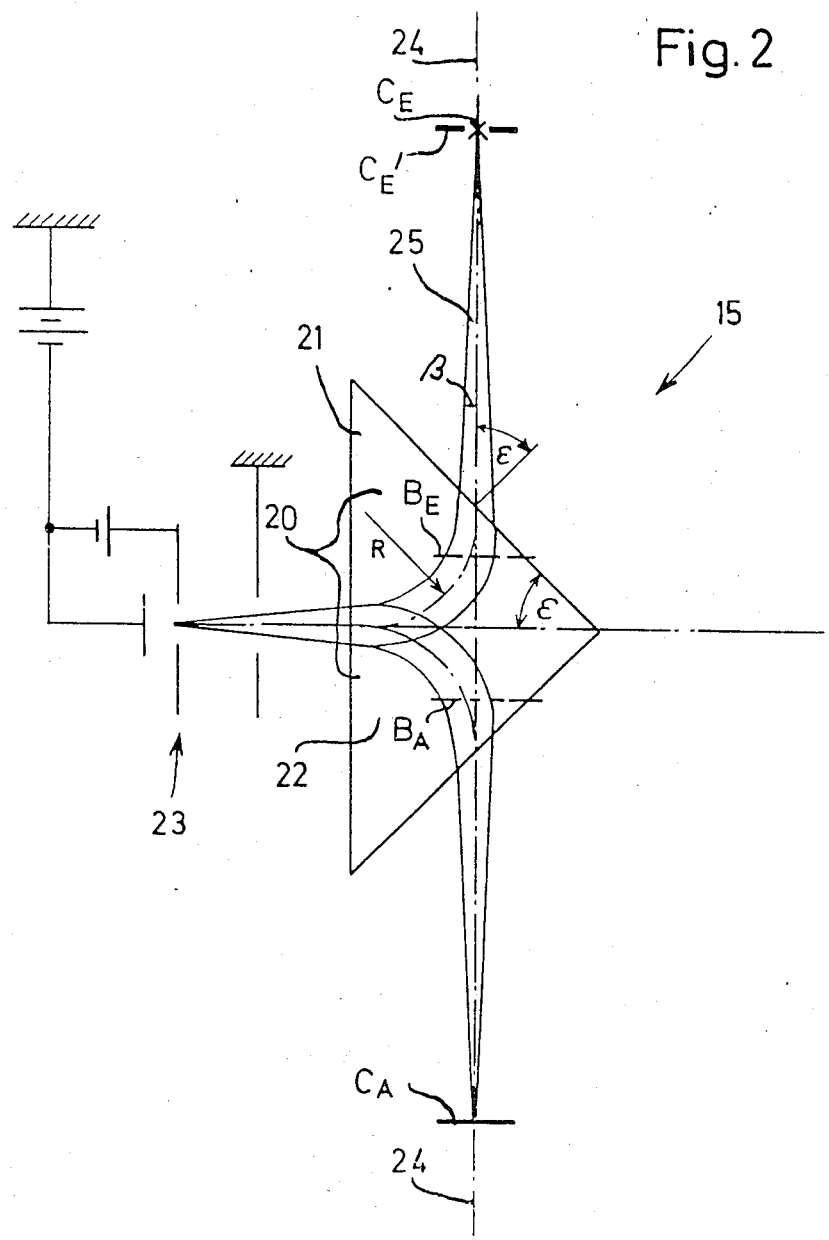

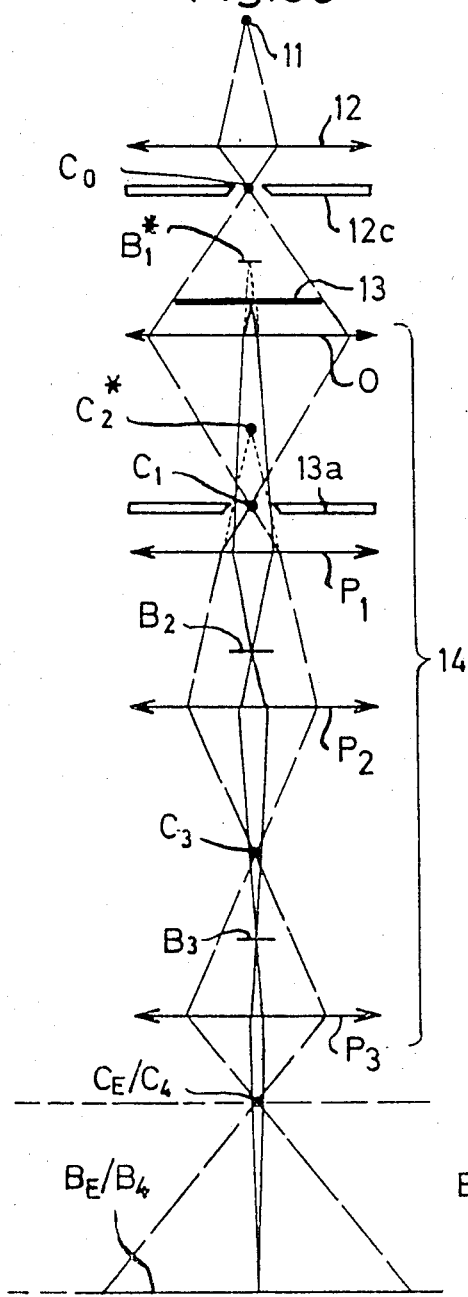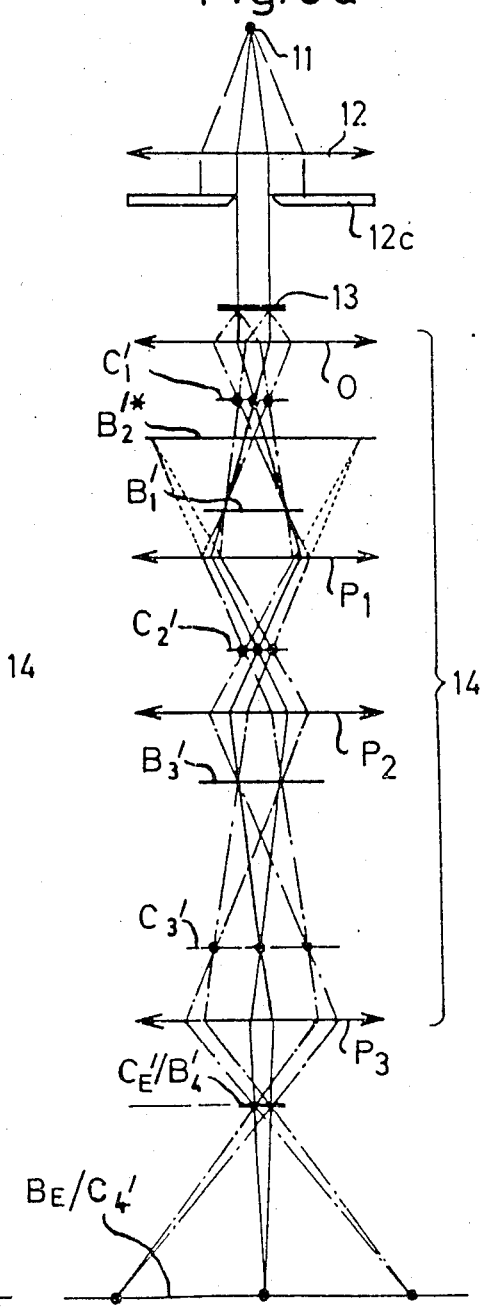

IMAGING METHOD AND APPARATUS FOR ELECTRON MICROSCOPES

This is a continuation of application Ser. No. 743,479, filed June 11, 1985.

BACKGROUND OF THE INVENTION

This invention relates to electron microscopes, and more particularly to a method and apparatus for producing improved images from such microscopes, both with regard to electron-energy filtered imaging of an object with a transmission electron microscope, and with regard to the electron-energy filtered imaging of an object diffraction pattern with a transmission electron microscope.

The invention deals with microscopes in which the electron beams proceeding from a source of electrons illuminate the object, and the object is then imaged by a first imaging stage into the input-image plane of an imaging electron-energy spectrometer, and at the same time the source of electrons is imaged into the input crossover point of the spectrometer. Furthermore, the electrons of a selectable energy range are filtered out in the spectrometer, and the filtered image of the object, from the output-image plane of the spectrometer, is then imaged into the final image-plane. The invention furthermore concerns a corresponding method and apparatus for object diffraction patterns.

One important advantage of a transmission electron microscope having an imaging electron-energy spectrometer is that, by the selection of electrons of a given energy range, a new form of high contrast object imaging is obtained, that is not possible in the case of conventional instruments. This can be noted very clearly in images of very thin unstained specimens having a selected energy loss ($\Delta E$) within the range of about 100 to 200 eV. However, an object image produced exclusively by elastically scattered electrons (energy loss $\Delta E=0$) so that all inelastically dispersed electrons ($\Delta E>0$) are eliminated, is also clearly improved in contrast, as compared with the unfiltered image.

Another important advantage of a transmission electron microscope having an imaging electron-energy spectrometer resides in the possibility of obtaining element-specific enhancement of object images (i.e., element distribution images) simultaneously over a relatively large selected specimen area in such manner that the energy range permitted to pass through by the electron-energy spectrometer corresponds to an element-specific interaction of the transmitted electrons with the object, and corresponds, for instance, to a K- or L- or M- absorption in the atomic shell of the element. In this way, not only qualitative but also (upon measurement of the intensity ratios and elimination of the background) quantitative atomic distribution iamges in thin objects (thickness equal to or less than 30 nm) can be obtained with very high spatial resolution (approximately equal to 0.5 nm) and with very high sensitivity of elemental detection (approximately equal to $2\times10^{-21}$ g), such as were not obtained heretofore by any other method of analysis. Maximum obtainable spatial resolution and sensitivity of detection of elements are of great importance both for biological and medical research and for the science of materials.

In addition, in the case of electron diffraction patterns, an imaging electron-energy spectrometer produces sharper images of the diffraction pattern.

Federal Republic of Germany Pat. No. 2,028,357 and its counterpart U.S. Pat. No. 3,624,393 of E. Torquebiau, granted Nov. 30, 1971, disclose an electron microscope which makes possible a filtering not only of the object image but also of the diffraction image. To accomplish this, an enlarged image of the diffraction pattern is produced by a first imaging stage consisting of three lenses in the input-image plane of the spectrometer (designated $B_2$ in the patent) and an object image is produced in the input crossover plane (designated $B_1$ in the patent). The disadvantages of this known device are that only one magnification is possible for the filtered diffraction pattern and that only a slight variation in magnification is possible for filtered object images, which variation is not indicated in the patent, and in which the excitation of the objective lens must be reset for the focusing of the image.

From the literature, a few other electron microscopes having imaging electron-energy spectrometers are known. In the Journal of Ultrastructure Research, volume 72 (1980), pages 336-348, there is an article by F. P. Ottensmeyer and J. W. Andrew, which describes an electron microscope having an imaging spectrometer between an objective lens with first and second intermediate lenses and a projective lens. This imaging spectrometer consists of an input lens, the actual prism-mirror-prism spectrometer (Castaing type), and an output lens.

This arrangement has the most flexible imaging optics of any arrangement known prior to the present invention. The change in magnification takes place essentially by changing the excitation on the two intermediate lenses. In this connection, however, the position of the image of the object and the image of the electron source (crossover) in front of the spectrometer are changed. By corresponding excitation of the input lens of the spectrometer, the crossover must be brought to the correct place for the actual spectrometer, and the position of the image of the object is corrected by refocusing the objective lens. The same procedure is necessary when the back focal plane of the objective is imaged, in order to image an electron diffraction pattern by varying the excitation of first and second intermediate lenses, into the spectrometer. The limiting of the imaging aperture of the spectrometer is effected by a field limiting aperture in the first intermediate image after the objective lens.

This known combination of electron microscope and electronenergy spectrometer, described in the above Journal article, has the following disadvantages:

1. The magnification range is limited to medium and high magnification ($>3000$ X); it is pushed upward by a factor of two as compared with the original electron microscope. The possible variation in magnification amounts to about 150:1.

2. For each magnification step, the input lens of the spectrometer must first be set in iteration steps in order to maintain the position of the crossover, whereupon the objective lenses are refocused for the focusing of the image, and the spectrometer adjusted laterally and rotationally, etc. Accordingly, a change in magnification is very time-consuming and thus leads to irreparable radiation damage in the case of objects which are sensitive to radiation. As a consequence, a single preadjusted magnification is used per operating session, e.g., morning or afternoon, etc.

3. The effective aperture for the spectrometer, i.e., the image of the field limiting aperture in the input-image plane, changes upon change in the magnification. Accordingly, for each magnification setting, a corresponding field limiting aperture must be selected in order to obtain optimum adaptation of spectrometer energy resolution to the desired image format (photograph format). This is practically impossible in view of the large number of magnification steps required.

4. The imaging electron-energy spectrometer of the prism-mirror-prism type (Castaing type) has clear aberrations which limit the energy-resolution capability. It is known, to be sure, from an article by J. W. Andrew, F. P. Ottensmeyer, and E. Martell in the papers of the Ninth International Congress on Electron Microscopy, Toronto, 1978, volume 1, pages 40-41, that by using curved entrance and exit surfaces of the prism, a reduction in aberrations is possible as compared with using flat or plane entrance and exit surfaces. However, no information is given in this article as to advantageous specific embodiments for such curved surfaces.

The object of the present invention is, therefore, to obtain, in a transmission electron microscope with an imaging electron-energy spectrometer, the largest possible range of magnification without the necessity of readjustment or refocusing upon a change in the magnification.

Another object is to provide, in such a microscope, a spectrometer-aperture diaphragm which is independent of the magnification, for selection of the energy resolution with optimum adaptation to the image-limiting area of the specific detector.

Still another object of the invention is to make possible, with the same transmission electron microscope, the imaging of energy-filtered diffraction patterns with a variation in magnification of at least 3:1.

A further object is to improve the energy resolution of the electron-energy spectrometer with prism-mirror-prism system.

SUMMARY OF THE INVENTION

These objects are achieved, according to the invention, by providing a transmission electron microscope in which the electron beams proceeding from a source of electrons illuminate the object, and the object is imaged by a first imaging stage into the input-image plane of an imaging electron-energy spectrometer and at the same time the source of electrons is image into the input crossover point of the spectrometer, and electrons of a selectable energy range are filtered out in the spectrometer and the filtered object image from the output-image plane of the spectrometer is imaged by a second imaging stage into the final-image plane, this arrangement being so designed and dimensioned that by the first imaging stage, the object which remains in unchanged position is imaged with a magnification variation of at least 8:1 and with low distortion, always into the input-image plane of the spectrometer and, at the same time, the image of the source of electrons is imaged always into the input crossover point of the spectrometer; and that by the second imaging stage, the output-image plane of the spectrometer is imaged with constant magnification into the final-image plane, this constant magnification being adapted merely to the image-limiting area of the detector which receives the image, such for example as a fluorescent screen, a photographic film, or an electronic detector.

For the electron-energy filtered imaging of object diffraction patterns, the diffraction pattern of the object which remains in an unchanged position is imaged in the first imaging stage with a magnification variation of at least 3:1 always into the input-image plane of the spectrometer, and at the same time the image of the object is imaged always into the input crossover plane of the spectrometer. The output-image plane of the spectrometer is imaged by the second imaging stage with a constant magnification into the final-image plane, the constant magnification being adapted merely to the image-limiting area of the specific detector.

In a preferred embodiment of the method, the first imaging stage produces four intermediate images of the object, the fourth intermediate image lying always in the input-image plane of the spectrometer, and simultaneously produces four crossovers (intermediate images of the source of electrons), the fourth crossover lying always in the input crossover point of the spectrometer. For high and medium magnifications, the second intermediate image is real or virtual while all other intermediate images are always real; furthermore, the third crossover is real or virtual while all other crossovers are always real. For small magnifications, the first intermediate image is always virtual, the second is real or virtual, and the last two intermediate images are always real; furthermore, the second and/or the third crossover is real or virtual, while the first and last crossovers are always real.

For object diffraction patterns, the first imaging stage produces the diffraction pattern and three intermediate images of the diffraction pattern, the third intermediate image lying always in the input-image plane of the spectrometer, all intermediate images being real. At the same time, the first imaging stage produces four intermediate images of the object, the fourth intermediate image lying always in the input crossover plane of the spectrometer, the second intermediate image being always virtual, while all other intermediate images are always real.

In a transmission electron microscope for carrying out the method of the invention, the first imaging stage is developed from four electron-optical lens groups which are connected with a current supply unit in which the required excitation current is established for each magnification stage and each lens. Each lens group may consist of one or more electron-optical lenses. The spectrometer aperture diaphragm is arranged as close as possible in front of the input-image plane, between the input crossover and the input image plane of the spectrometer, and has exchangeable circular openings for selection of the spectrometer aperture and/or of the energy resolution.

Other embodiments of the invention will be apparent from the detailed description which follows.

BRIEF DESCRIPTION OF THE DRAWINGS

In the accompanying drawngs, which show an illustrative embodiment of the invention, FIG. 1 is a schematic axial section illustrating the basic construction of a transmission electron microscope serving for carrying out the method of the invention;

FIG. 2 is a diagrammatic representation of the input and output parameters of an electron-energy spectrometer with a mirror-prism-mirror system;

FIGS. 3a, 3b, 3c, and 3d illustrate ray paths of the first imaging stage at different magnification ranges for object imaging and for imaging of object diffraction patterns;

DESCRIPTION OF THE PREFERRED EMBODIMENT

Figure 3A:
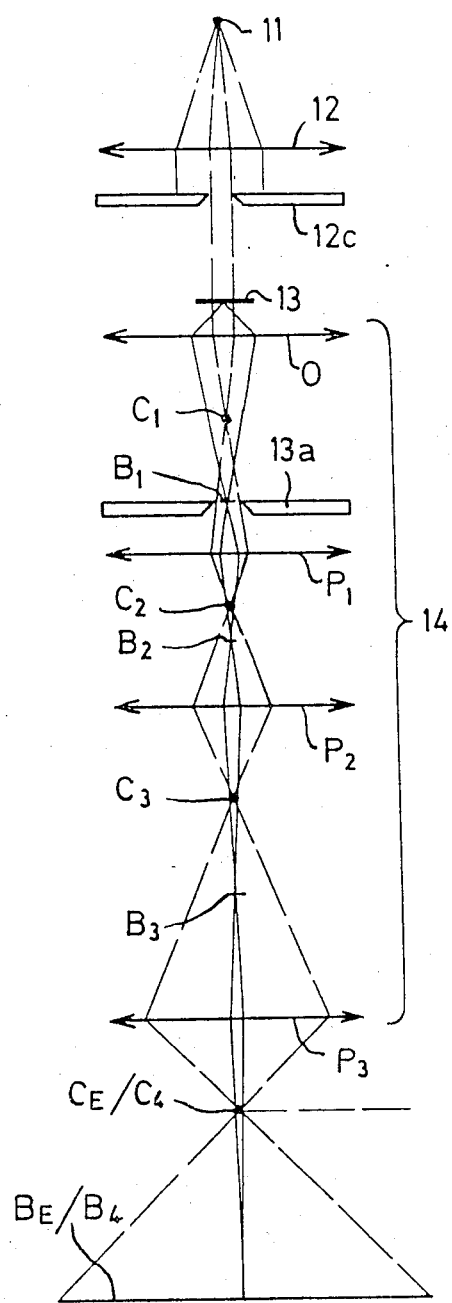
Figure 3B:
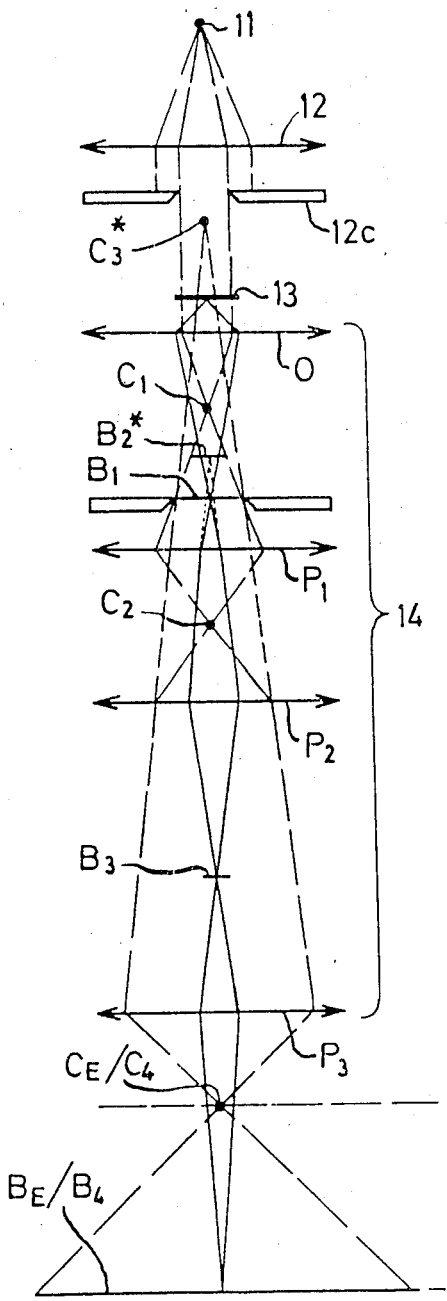

Referring now to FIG. 1, the basic construction of a transmission electron microscope suitable for carrying out the method of the present invention is shown in general at 10. It includes an electron source indicated in general at 11, having a cathode 11a and an accelerating electrode 11b. The lenses 12a and 12b form the condenser system, and there is a condenser diaphragm 12c. The object which is to be examined and imaged is arranged replaceably at 13 within the objective lens 0. This objective lens 0 forms an image of the object at $B_1$, which image, in the case of medium to high magnification, lies in the plane of the field limiting aperture 13a as seen in FIGS. 3a and 3b, for example.

From there, the intermediate image is imaged by the further lenses $P_1$, $P_2$, and $P_3$ of the first imaging stage 14 into the imaging electron-energy spectrometer indicated in general at 15. The aperture 42 is arranged in front of this spectrometer, that is, at the entrance or input thereof. At the exit or output of this 1:1 imaging spectrometer, there is the slit aperture or diaphragm 43, by which a selectable energy range is chosen.

Following the spectrometer, there is a second imaging stage indicated in general at 16, having the imaging lenses $P_4$ and $P_5$. This second imaging stage 16 forms the output image of the spectrometer 15 in the final-image plane 17 which contains any desired detector or detectors conveniently shiftable selectively into image-receiving position. For example, the detectors may include a luminescent screen 17a, a camera with photographic film 17b and an electronic detector 17c as seen schematically in FIG. 1.

For a better understanding and more exact description of the imaging conditions, it is desirable first to describe the electron-optical properties of the known spectrometer 15. The basic construction of a known form of prism-mirror-prism system (Castaing type) is shown in FIG. 2. The spectrometer 15 comprises a magnetic prism 20 which is produced by a magnet having two pole pieces whose terminal surfaces have the shape of the prism 20 and lie closely below and above the plane of the drawing. It has two active areas 21 and 22 of mirror symmetry and an electrostatic mirror 23. The electron beam 25 incident along the optical axis 24 with the aperture angle $\beta$ (Beta) is deflected by the upper active area 21 by about 90° to the mirror 23 on which it is reflected. Thereupon the returning (reflected) electron beam is again deflected by about 90° in the lower active area 22 and leaves the spectrometer in the direction of the optical axis 24. The exact angle of deflection depends in each case on the energy of the electrons, so that in the dispersion plane $C_A$ a spectrum of the energy of the electrons transmitted from the object is produced, a portion of which can be selected out by the knife edges or slit jaws 43b, 43c (FIG. 4) of the above mentioned slit aperture 43.

The spectrometer 15 images the input-image plane $B_E$ into the output-image plane $B_A$ on a scale of 1:1, and images the input crossover point $C_E$ into the dispersion plane $C_A$. For dependable operation of the spectrometer in an electron microscope, it is necessary that the image of the beam source 11 be imaged into the input crossover point $C_E$ and that the image of the object 13 be imaged into the input-image plane $B_E$ by the electron optical lenses arranged in front of the spectrometer; or alternatively, in the case of object diffraction patterns, that the image of the beam source 11 be imaged into the input-image plane $B_E$ and that the object image be imaged into the input crossover plane $C_E'$. Only if these conditions are precisely satisfied are schromatic imaging and optimal energy filtering obtained by the spectrometer.

In order to satisfy these conditions for the largest possible range of magnification, the first imaging stage 14 is constructed, according to the invention, from four electron-optical lens groups O, $P_1$, $P_2$, and $P_3$. Each of these four lens groups may consist of a single lens or a plurality of lenses. Switching to different magnifications, and switching from object imaging to diffraction imaging and vice versa, is effected by separate excitations of the electromagnetic coils of the various lens groups.

The imaging and illuminating ray paths for different magnification ranges for object imaging and for diffraction imaging are illustrated in FIGS. 3a to 3d, to which reference is now made.

FIG. 3a shows in dashed or broken lines the illuminating-ray path and in solid lines the imaging ray path for an object point on the optical axis for a total magnification in the range of about 25,000 X to 250,000 X or for a magnification by the first imaging stage 14 of about 300 X to 3,000 X. By means of the condenser system 12, the object at 13 is illuminated with an approximately parallel electron beam whose diameter is determined by the condenser aperture 12c. The first lens groups O produces a real intermediate image $B_1$ of the object 13 and a real intermediate image (crossover) $C_1$ of the electron source 11. The second lens system $P_1$ produces the real intermediate image $B_2$ and the real crossover $C_2$. The third lens system $P_2$ produces the real intermediate image $B_3$ and the real crossover $C_3$. Finally, the lens system $P_3$ produces in the input plane $B_E$ of the spectrometer 15 the real intermediate image $B_4$ of the object 13, and produces in the input crossover point $C_E$ of the spectrometer the real crossover $C_4$.

These imaging and illuminating ray paths as just described differ from previously known ray paths in that, up to an intermediate image in front of the last imaging stage, their last crossover point before the intermediate image has no defined, constant position. The decisive factor is that with the same first imaging stage 14, consisting of the lens groups O, $P_1$, $P_2$, and $P_3$, the ray paths shown in FIGS. 3b to 3d are also produced.

In FIG. 3b, the illuminating ray paths are shown, as in FIG. 3a, by dashed or broken lines, and the imaging ray paths in solid lines, when operating under conditions of total magnification in the range of 2,500 X to 25,000 X, or magnification by the first imaging stage 14 of about 30 X to 300 X. The illumination of the object 13 is effected in the same manner as in FIG. 3a, and the first lens group O again produces a real intermediate image $B_1$ of the object and a real crossover $C_1$. However, in this case the second lens group $P_1$ is so slightly energized that while it produces a real crossover $C_2$ it produces only a virtual intermediate image $B_2^*$ of the object 13. Then the third lens group $P_2$ produces a real intermediate image $B_3$ of the object 13, but only a virtual crossover $C_3^*$. Finally, the fourth lens group $P_3$ produces a real intermediate image $B_4$ of the object 13 in the input-image plane $B_E$ of the spectrometer 15 and a real crossover $C_4$ in the input crossover point $C_E$ of the spectrometer 15.

These imaging and illuminating ray paths illustrated and described in connection with FIG. 3b differ from previously known ray paths in that, like those in FIG. 3a, their last crossover point in front of the intermediate image has no defined, constant position.

FIG. 3c illustrates the ray paths when the system is operated at a total magnification in the range of about 100 X to 2,000 X, or a magnification in the front imaging stage 14 of about 1.2 X to 24 X. As in FIGS. 3a and 3b, the illuminating ray paths are shown in dashed or broken lines, and the imaging ray paths in solid lines. In this case, the ray paths correspond, up to the intermediate image $B_2$, to the ray paths disclosed in Federal Republic of Germany Pat. No. 2,742,264 of Apr. 30, 1981 and its counterpart U.S. Pat. No. 4,194,116 of Wilhelm Egle, granted Mar. 18, 1980.

When operating under these conditions illustrated in FIG. 3c, as distinguished from the conditions present in FIGS. 3a and 3b, the condenser lens 12 is so energized that an intermediate image $C_0$ (crossover) of the beam source 11 is produced already in front of the object 13, namely in or in the vicinity of the condenser diaphragm 12c. Also, the first lens group O is so weakly energized that the next crossover $C_1$ lies in the field limiting aperture 13a, and only a virtual image $B_1^*$ is produced of the object 13. The second lens group $P_1$ produces a real intermediate image $B_2$ of the object 13 and a virtual crossover $C_2^*$. The third lens group $P_2$ produces a real intermediate image $B_3$ and a real crossover $C_3$. Finally, the fourth lens group $P_3$ produces a real intermediate image $B_4$ of the object 13 in the input-image plane $B_E$ of the spectrometer 15 and a real crossover $C_4$ in the crossover entrance point $C_E$ of the spectrometer.

FIG. 3d shows the ray paths for the imaging of electron diffraction patterns. The illumination of the specimen 13 is effected again in the same way as in FIGS. 3a and 3b. From the electrons scattered on the specimen or object 13, the lens group O produces the object diffraction pattern $C_1'$ and the object image $B_1'$. The solid line ray path corresponds to the electrons not scattered by the object 13, and the dash-dot lines represent ray paths of electrons scattered by the object 13.

The second lens group $P_1$ produces the diffraction intermediate image $C_2'$ of the object diffraction pattern $C_1'$ and the virtual intermediate image $B_2^*$ of the object image $B_1'$. A real diffraction intermediate image $C_3'$ and a real object intermediate image $B_3'$ are then produced by the third lens group $P_2$, and they are then imaged by the fourth lens group $P_3$ into the input image plane $B_E$ and the input crossover plane $C_E'$ of the spectrometer.

For each of the ray paths shown in FIGS. 3a to 3d, several magnification steps are possible. The number of such steps is merely a question of expense and benefit. The decisive factor is that with the ray paths for object images shown in FIGS. 3a and 3b, a variation in magnification of about 100:1 with any desired gradation is possible with a defined and constant position of the intermediate image $B_4$ and of the crossover $C_4$ in the crossover entrance point $C_E$ of the spectrometer. This variation in magnification is extended by the ray paths described in connection with FIG. 3c to about 2,500:1. The ray paths shown in FIG. 3d permit, for diffraction patterns, a variation in magnification of 20:1 with the same first imaging stage 14. In all cases, the result is obtained that after a single sharp focusing of the object 13 or of the diffraction pattern, which of course is carried out in each case at the highest magnification step, no readjustment or refocusing is necessary upon change to any other magnification step. As already indicated, each of the lens groups O, $P_1$, $P_2$, and $P_3$ may consist of a single lens or of more than one lens.

Figure 4:
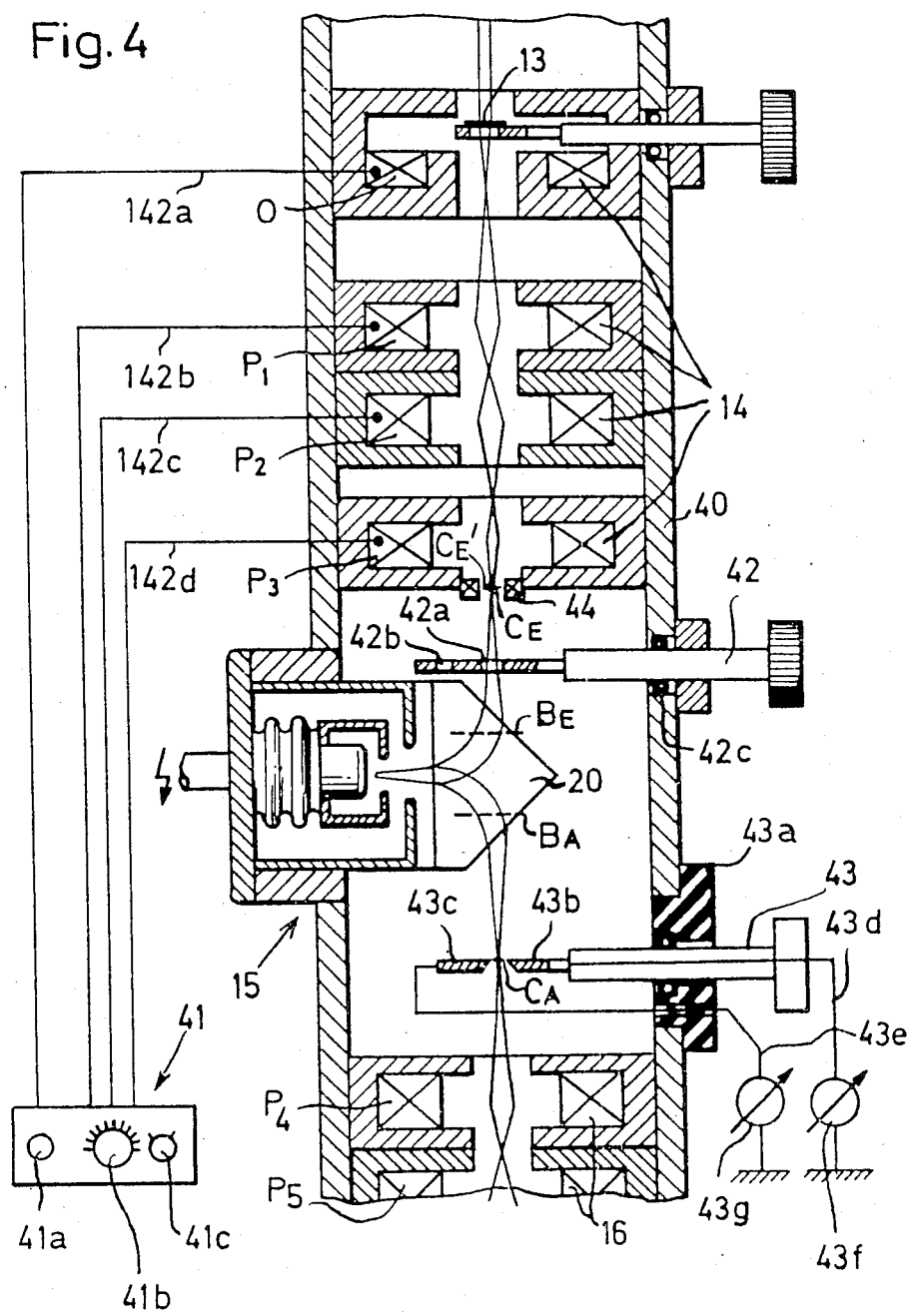
FIG. 4 is a view similar to a portion of FIG. 1 on a larger scale, illustrating additional details of the construction of the first imaging stage and of the electron-energy spectrometer, including aperture and slit diaphragms.

The adjustment of the different magnification steps is effected by means of a control unit schematically shown at 41 in FIG. 4. This control unit includes customary controls such as ordinarily needed for operation of an electron microscope, including a regulator 41a for the focusing of the object, a magnifier-step switch or control 41b, and a switch 41c for switching from object imaging to diffraction imaging and vice versa. The control unit is operatively connected to the microscope by suitable conductor cables such as those shown at 142a to 142d, to supply the coils of the various lenses with the excitation currents necessary for the magnification stages and to supply any other currents or voltage that may be needed for the control and operation of the microscope.

The details of the control unit are not important for purposes of the present invention, and the proper design of such a unit is within the capacity of those skilled in this art, once those persons have become familiar with the present disclosure and understand the way the electron microscope is intended to be operated and what is to be accomplished. Merely as a general statement of some of the possible characteristics of the control unit, it may be said that, for instance, the unit may produce lens excitation currents for each lens by means of an analog control, as by switching desired value resistors in or out of the circuits. It is also possible, with modern technological means, to use electronic digital controls in which the desired values are stored in an electronic fixed-value storage (E-PROM) and converted via a digital-analog converter into the desired lens excitation currents.

FIG. 4 also shows diagrammatically the construction of the aperture and its supporting and operating member, all being collectively designated by the numeral 42. In the ideal case, this aperture should be located in the input-image plane $B_E$ of the spectrometer. Since this is hardly possible for mechanical reasons, due to the very slight separation of the pole pieces of the prism 20, the aperture is arranged as closely as possible in front of the prism 20. This is sufficient in practice because, as a result of the small size of the image of the electron source in the input crossover point $C_3$, there is always a sharply delimited shadow imaging of the aperture 42 into the input-image plane $B_E$.

The input aperture is formed by any desired number of openings in a diaphragm plate which extends across the electron optical axis, two circular openings 42a and 42b of different diameters being here illustrated. Any selected one of the openings may be selectively brought into the ray path (the electron optical axis) by manipulating the control member or handle which supports the apertured diaphragm plate and which passes through the wall 40 of the microscope body by means of a vacuum-tight packing 42c.

Because the magnification adjustment of the first imaging stage 14 takes place in front of the aperture 42, and because the second imaging stage 16 behind the spectrometer 15 normally operates with constant magnification which is merely adapted to the image-limiting area of the detector 17a, 17b, or 17c, if follows that the action of the aperture 42 is independent of the magnification. The selective use of the circular diaphragm openings 42a and 42b having different diameters permits the adjustment of different aperture angles β (Beta) of the spectrometer 15. In spite of the substantial improvement in the imaging properties of the spectrometer 15 by using circular entrance and exit surfaces 51, 52, and 53 as further described below, the energy resolution of the spectrometer in the dispersion plane $C_A$ is still dependent on the aperture. The possibility of setting different aperture angles (by adjusting the aperture 42) therefore permits a change in the energy resolution of the spectrometer so that the resolution can be adapted either optimally to the image-limiting surface of the specific detector 17b or 17c, in which case for β<10 mrad the energy resolution is <15 eV, or by the selection of a very small (image-limiting) aperture the energy resolution can be improved up to the energy width of the beam source 11, i.e., can be reduced to the minimum energy width of 0.8 eV for a thermal beam source.

In FIG. 4 there is also shown diagrammatically the slit aperture 43 which is arranged in the dispersion plane $C_A$ of the spectrometer 15. The control or adjusting member of this slit aperture 43 extends in vacuum-tight manner through an insulator 43a which is tightly seated in the wall 40 of the microscope body or column. The two slit jaws 43b and 43c can be displaced or adjusted jointly and also toward and away from each other to vary the size of the slit opening between them. They are insulated from each other, and are connected by separate electrical conductors 43d and 43e to current measuring instruments 43f and 43g outside the microscope column 40. With this arrangement, a part of the spectrum can be selected for the object imaging, and the electron current of different parts of the spectrum can be measured directly.

At the lower end of the first imaging stage 14 there is a deflection system 44 also shown in FIG. 4. This is arranged in the input crossover plane $C_E'$ of the spectrometer 15. With this deflection system 44, the electron beam emerging from the first imaging stage 14 can be aligned precisely in the optical axis 24 (FIG. 2) of the spectrometer 15 without any other imaging parameters being affected.

As shown in FIGS. 1 and 4, the spectrometer 15 is followed by the second imaging stage 16. It has two purposes:

(a) The output-image plane $B_A$ of the spectrometer 15 is imaged with a constant magnification of about 80 X into the final-image plane 17. This constant magnification is adapted merely to the image-limiting area of the detector and therefore either to the final image fluorescent screen 17a, or to the format of the photographic film 17b for photographic recording, or to the active area of the electronic detector 17c (FIG. 1). When one is using an electronic detector 17c, which generally is small (for instance, a Faraday cage) as compared with the size of a final image fluorescent screen, the total magnification with the second imaging stage 16 can, however, also be intentionally so selected that the electronic detector 17c covers only a selected partial region of the entire image in the final image-plane 17. In this way, for instance, in the case of a total magnification of 250,000 X and with a detector diameter of 2.5 mm, the analysis of the (chemical) elements of an object region of 10 nm diameter is possible, while at the same time a region which is larger in diameter by a factor of about 50 can be observed on the final image fluorescent screen 17a. Thus both an easy determination of interesting regions and an exact localization of the region for such a microanalysis into the detector aperture is possible. In this way, one avoids the problems which otherwise occur upon point illumination, for instance with electron beam probes, such as object contamination, errors in localization, small probe currents, etc. In this case it is particularly favorable to record the energy spectrum not by displacing the energy selecting slit 43, but rather (as known from the above mentioned article in volume 72 of the Journal of Ultrastructure Research) by varying the acceleration voltage of the electron source 11, since in this way a larger energy range can be covered with optimum imaging conditions.

(b) The second purpose of the second imaging stage 16 is this: As known from the above mentioned article in the Journal of Ultrastructure Research, the second imaging stage 16 can also be adjusted to the dispersion plane $C_A$. In this case, with the slit jaws 43b, 43c moved out of the ray path, a partial region of the spectrum is imaged in the final-image plane 17. This partial spectrum can be recorded on a film 17b. If an electronic detector 17c is used, it is again more favorable to record the energy spectrum by varying the acceleration voltage of the electron source 11. If the energy resolution capability is not already sufficient due to the small size of the electronic detector, the slit jaws 43b, 43c can be brought into the ray path. In these cases, in contradistinction to "a" above, an analysis of the (chemical) elements of the entire illuminated region of the object 13 is carried out. This region has, e.g., a diameter of about 3 μm in the case of an overall magnification of 250,000 X.

The second imaging stage 16 is formed of at least two projection lenses $P_4$, $P_5$, the lens powers of which can be changed independently of each other. The first lens $P_4$ images either the output-image plane $B_A$ or the dispersion plane $C_A$ into the object plane of the second lens $P_5$. The second lens effects the optimal adaptation of the spectrometer aperture or the adaptation of the spectrum region to the different final image formats at the final image plane 17, i.e., to different photograph formats of different cameras, or to the size of the detector system, etc., as the case may be. The detector system may be, for instance, a Faraday cage, a scintillator photomultiplier combination, a CCD array, or a transparent fluorescent screen with a television camera tube behind it.

For a preferred embodiment of the first and second imaging stages, the spacings and the focal lengths are as indicated in the following tables, one electron optical lens being provided for each lens system.

| SPACINGS | |
|---|---|
| 0 to $P_1$ = | 92 mm |
| $P_1$ to $P_2$ = | 57 mm |
| $P_2$ to $P_3$ = | 103 mm |
| $P_3$ to $C_E$ = | 38 mm |
| $P_3$ to $B_E$ = | 110 mm |
| $C_A$ to $P_4$ = | 26 mm |
| $B_A$ to $P_4$ = | 98 mm |
| $P_4$ to $P_5$ = | 54 mm |

| FOCAL LENGTHS |
|---|
| 0 = 2.6 ... 40 mm |
| $P_1$ = 7.5 ... 40 mm |

-continued

| FOCAL LENGTHS |
| --- |
| $P_2 = 6 \ldots 80$ mm |
| $P_3 = 23 \ldots 52$ mm |
| $P_4 = 18 \ldots 44$ mm |
| $P_5 = 3 \ldots 6$ mm |

Figure 5:
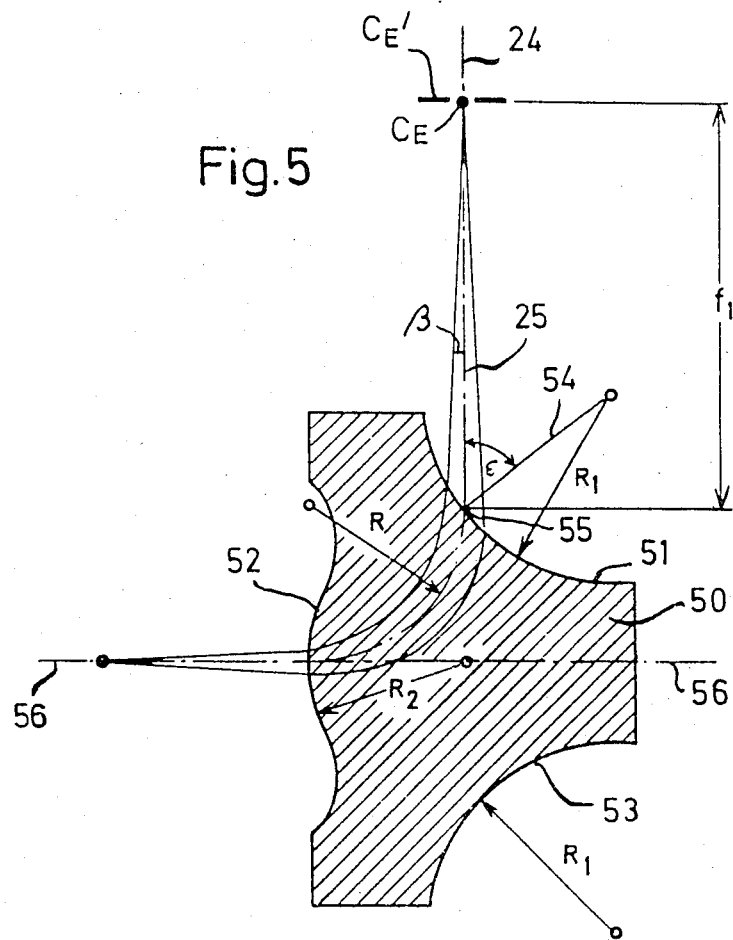
FIG. 5 is a view illustrating the circularly developed entrance and exit surfaces of the spectrometer prism.

FIG. 5 illustrates the parameters necessary to characterize a particularly favorable development of a prism-mirror-prism spectrometer. The hatched region 50 shows the shape of the terminal surfaces of the pole pieces of the magnet, between which the electron beam 25 passes. The axis 24 of the incident electronic beam 25 enters the prism at the entrance point 55. The line 54 is a normal to the entrance surface 51 at this entrance point 55, and $\epsilon$ (Epsilon) denotes the angle between this normal 54 at the entrance point and the axis 24. R is the radius of the curved path of the electron beam 25 deflected in the prism. The distance of the entrance point 55 from the input crossover point $C_E$ is designated as focal length $f_1$.

Instead of the conventional triangular shape of the Castaing prism with plane entrance and exit surfaces, the entrance surface 51 has the shape of a concave circular section with the radius $R_1$. The exit surface 52 to the mirror has the shape of a convex circular section with the radius $R_2$. This curved surface 52 constitutes also the entrance surface of the reflected electron beam coming back to the prism after reflection by the mirror. This reflected beam is deflected in the prism and emerges again from the prism through the curved surface 53. This final exit surface 53 has the same radius $R_1$ as the initial entrance surface 51, and is arranged symmetrically with respect thereto, relative to the axis 56, as will be apparent from FIG. 5.

By using the curved entrance and exit surfaces 51, 52, and 53 as here described, the focusing properties of the spectrometer are substantially improved both in the plane of the drawing (FIG. 5) and perpendicular thereto, so that the aberrations of second order are neglibile up to aperture $\beta$ of about 10 mrad.

A particularly favorable range of dimensions is as follows: The above mentioned angle $\epsilon$ should be in the range from 40° to 55°. The quotient of the radius $R_1$ of the curved surfaces 51 and 53 divided by the radius R of the circular paths in the spectrometer should be in the range of 1.0 to 1.35. The quotient of the radius $R_2$ of the rear curved surface 52 divided by the radius R of the curved paths in the spectrometer should be in the range of 0.8 to 1.8. The quotient of the input focal length $f_1$ of the spectrometer divided by the radius R of the circular paths within the spectrometer should be equal to or greater than 1.8.

These advantageous and preferred relationships may be expressed by the following mathematical formulas.

$$1.0 < R_1/R < 1.35$$

$$0.8 < R_2/R < 1.8$$

$$40° < \epsilon < 55°$$

$$f_1/R \geq 1.8$$

Further improvement in the focusing properties is possible by using non-circularly curved limits of the pole pieces. However, it is more difficult and expensive to produce non-circular curved shapes, so that it is preferred in most cases to use the more easily and simply produced circular curves above described, for the curved surfaces 51, 52, and 53 of the pole pieces of the spectrometer. The circularly curved shapes give sufficiently good results for most requirements.

What is claimed is

1. A transmission electron microscope capable of producing enlarged images throughout a high magnification range and a medium magnification range, said microscope comprising:
   (a) means for holding an object to be examined in a predetermined fixed object plate;
   (b) a source of electrons providing a beam for illuminating said object;
   (c) an imaging electron-energy spectrometer having a predetermined fixed input image plane and a predetermined fixed input crossover point as well as a predetermined fixed output image plane;
   (d) first imaging means including at least four electron-optical lens groups for producing an image of said object at said input image plane of said spectrometer and producing an image of said source of electrons at said input crossover point of said spectrometer;
   (e) said first imaging means having a first lens group producing a first real intermediate image of said object and a first real intermediate image of said source;
   (f) said first imaging means having a second lens group imaging said first intermediate image of said object to form a second intermediate image of said object which is real during operation in said high magnification range and which is virtual during operation in said medium magnification range; and imaging said first intermediate image of said source to form a second real intermediate image of said source;
   (g) said first imaging means having a third lens group imaging said second intermediate image of said object to form a third real intermediate image of said object and imaging said second intermediate image of said source to form a third intermediate image of said source which is real during operation in said high magnification range and which is virtual during operation in said medium magnification range;
   (h) said first imaging means further having a fourth lens group imaging said third intermediate image of said object to form a fourth real intermediate image of said object at said input image plane of said spectrometer and imaging said third intermediate image of said source to form a fourth real intermediate image of said source at said input crossover point of said spectrometer;
   (i) current supply means connected to respective ones of said lens groups for adjusting the current supplied thereto so as to cause said first imaging means to always image said source into said input crossover point and to always image said object into said input image plane irrespective of changes in magnification within said range thereby avoiding manual refocusing of said first imaging means; and,
   (j) second imaging means arranged downstream of said spectrometer for imaging an image of said object in said output image plane of said spectrometer into a final image plane.

2. The invention defined in claim 1, wherein each of said four electron-optical lens groups comprises one or more electron-optical lenses.

3. The invention defined in claim 1, wherein said spectrometer includes means in its dispersion plane for filtering out a selected portion of electrons from an image beam entering said spectrometer from said input image plane and delivering the filtered beam to form an image at an output image plane, said microscope further comprising:
  (k) said second imaging means producing in said final-image plane a filtered image of said object reproduced from said image at said output image plane of said spectrometer; and
  (l) detector means located at said final-image plane, said detector means having a limited usable area;
  (m) said second imaging means operating at substantially constant magnification, the magnification of said second imaging means being selected to accommodate the size of the image produced thereby at said final-image plane to said usable area of said detector means.

4. The invention defined in claim 1, whereby said high magnification range is about 25,000x to 250,000x and said medium magnification range is about 2,500x to 25,000x.

5. The invention defined in claim 1, further comprising deflection means (44) located substantially at said input crossover point, whereby a bundle of electron beams emerging from said first imaging means is directed accurately to an input axis of said spectrometer.

6. The invention defined in claim 1, further comprising an adjustable aperture (42) arranged in the path of electron beam between said input crossover point of said spectrometer and said input image plane of said spectrometer; said adjustable aperture diaphragm having a plurality of circular apertures of different sizes, any one of which is selectively placeable in said path of electron beams.

7. The invention defined in claim 1, wherein said spectrometer has an output crossover point defining a dispersion plane perpendicular to the optical axis, said electron microscope further comprising a slit aperture (43) of variable width located in said dispersion plane; said slit diaphragm comprises two slit jaws (43b, 43c) movable relative to each other to vary the size of a slit between them, said jaws being insulated from each other, and means including separate electrical conductors operatively connected to the separate jaws for measuring separately the electrical conditions of each jaw.

8. The invention defined in claim 1, wherein said imaging electron-energy spectrometer (15) is a prism-mirror-prism system having a prism (20) which has non-planar entrance and exit surfaces (51, 52, 53).

9. The invention defines in claim 8, wherein said enctrance and exit surfaces of said prism are curved substantially along arcs of circles, and wherein the characteristics of said prism are substantially in accordance with the following formulas:

$$1,0 < R_1/R < 1,35$$

$$0,8 < R_2/R < 1,8$$

$$40° < \epsilon < 55°$$

$$f_1/R \geq 1.8$$

in which $R_1$ represents the radius of curvature of the initial entrance surface (51) and the final exit surface (53) of the prism, $R_2$ represents the radius of curvature of the intermediate exit and re-entrance surface (52) thereof, R represents the radius of the circular paths of rays within the prism, $f_1$ represents the input focal length of the spectrometer, and $\epsilon$ represents the angle between said axis of the electron beam entering the prism and a normal to the entrance surface of the point where the axis strikes the surface.

10. The invention defined in claim 1, said second imaging means producing in said final-image plane an image reproduced from an image at an output image plane of said spectrometer, said second imaging means having two electron-optical lens groups, the focal lengths of said lens groups and their spatial relationship to each other being substantially in accordance with the following data:

Focal lengths

First lens group of first image means: 2,6 to 40 mm:
Second lens group of first imaging means: 7,5 to 40 mm:
Third lens group of first imaging means: 6 to 80 mm:
Fourth lens group of first imaging means: 23 to 52 mm:
First lens group of second imaging means: 18 to 44 mm:
Second lens group of second imaging means: 3 to 6 mm:

Spacings

Between first and second lens groups (first imaging means):=92 mm;
Between second and third lens groups:=57 mm;
Between third and fourth lens groups:=103 mm;
Fourth group to input crossover image plane of spectrometer:=38 mm;
Fourth group to input object image plane of spectrometer:=110 mm;
Output crossover image plane of spectrometer to first lens group of second imaging means:=26 mm;
Output object image plane of spectrometer to first lens group of second imaging means:=98 mm;
First to second group of second imaging means:=54 mm.

11. A transmission electron microscope capable of producing enlarged images throughout a low magnification range said microscope comprising:
  (a) means for holding an object to be examined in a predetermined fixed object plane;
  (b) a source of electrons providing a beam for illuminating said object;
  (c) an imaging electron-energy spectrometer having a predetermined fixed input image plane and a predetermined fixed input crossover point as well as a predetermined fixed output image plane;
  (d) first imaging means including at least four electron-optical lens groups for producing an image of said object at said input image plane of said spectrometer and producing an image of said source of electrons at said input crossover point of said spectrometer;
  (e) said first imaging means having a first lens group producing a first virtual intermediate image of said object and a first real intermediate image of said source;
  (f) said first imaging means having a second lens group imaging said first intermediate image of said object to form a second real intermediate image of said object and imaging said first intermediate image of said source to form a second virtual intermediate image of said source;

(g) said first imaging means having a third lens group imaging said second intermediate image of said object to form a third real intermediate image of said object and imaging said second intermediate image of said source to form a third real intermediate image of said source;

(h) said first imaging means further having a fourth lens group imaging said third intermediate image of said object to form a fourth real intermediate image of said object at said input image plane of said spectrometer and imaging said third intermediate image of said source to form a fourth real intermediate image of said source at said input crossover point of said spectrometer;

(i) current supply means connected to respective ones of said lens groups for adjusting the current supplied thereto so as to cause said first imaging means to always image said source into said input crossover point and to always image said object into said input image plane irrespective of changes in magnification within said range thereby avoiding manual refocusing of said first imaging means; and, (j) second imaging means arranged downstream of said spectrometer for imaging an image of said object in said output image plane of said spectrometer into a final image plane.

12. The invention defined in claim 11, wherein each of said four electron-optical lens groups comprises one or more elctron-optical lenses.

13. The invention defined in claim 11, wherein said spectrometer includes means in its dispersion plane for filtering out a selected portion of electrons from an image beam entering said spectrometer from said input image plane and delivering the filtered beam to form an image at an output image plane, said microscope further comprising:

(k) said second imaging means producing in said final-image plane a filtered image of said object reproduced from said image at said output image plane of said spectrometer; and (l) detector means located at said final-image plane, said detector means having a limited usable area;

(m) said second imaging means operating at substantially constant magnification, the magnification of said second imaging means being selected to accommodate the size of the image produced thereby at said final-image plane to said usable area of said detector means.

14. The invention defined in claim 11, whereby said low magnification range is about 100x to 2000x.

15. The invention defined in claim 11, further comprising deflection means (44) located substantially at said input crossover point, whereby a bundle of electron beams emerging from said first imaging means is directed accurately to an input axis of said spectrometer.

16. The invention defined in claim 11, further comprising an adjustable aperture (42) arranged in the path of electron beam between said input crossover point of said spectrometer and said input image plane of said spectrometer; said adjustable aperture diaphragm having a plurality of circular apertures of different sizes, any one of which is selectively placeable in said path of electron beams.

17. The invention defined in claim 11, wherein said spectrometer has an output crossover point defining a dispersion plane perpendicular to the optical axis, said electron microscope further comprising a slit aperture (43) of variable width located in said dispersion plane; said slit diaphragm comprises two slit jaws (43b, 43c) movable relative to each other to vary the size of a slit between them, said jaws being insulated from each other, and means including separate electrical conductors operatively connected to the separate jaws for measuring separately the electrical conditions of each jaw.

18. The invention defined in claim 11, wherein said imaging electron-energy spectrometer (15) is a prism-mirror-prism system having a prism (20) which has non-planar entrance and exit surfaces (51, 52, 53).

19. The invention defined in claim 18, wherein said enctrance and exit surfaces of said prism are curved substantially along arcs of circles, and wherein the characteristics of said prism are substantially in accordance with the following formulas:

$$1,0 < R_1/R < 1,35$$

$$0,8 < R_2/R < 1,8$$

$$40° < \epsilon < 55°$$

$$f_1/R \geqq 1.8$$

in which $R_1$ represents the radius of curvature of the initial entrance surface (51) and the final exit surface (53) of the prism, $R_2$ represents the radius of curvature of the intermediate exit and re-entrance surface (52) thereof, R represents the radius of the circular paths of rays within the prism, $f_1$ represents the input focal length of the spectrometer, and $\epsilon$ represents the angle between said axis of the electron beam entering the prism and a normal to the entrance surface at the point where the axis strikes the surface.

20. The invention defined in claim 11, said second imaging means producing in said final-image plane an image reproduced from an image at an output image plane of said spectrometer, said second imaging means having two electron-optical lens groups, the focal lengths of said lens groups and their spatial relationship to each other being substantially in accordance with the following data:

Focal lengths

First lens group of first imaging means: 2,6 to 40 mm;
Second lens group of first imaging means: 7,5 to 40 mm;
Third lens group of first imaging means: 6 to 80 mm;
Fourth lens group of first imaging means: 23 to 52 mm;
First lens group of second imaging means: 18 to 44 mm;
Second lens group of second imaging means: 3 to 6 mm.

Spacings

Between first and second lens groups (first imaging means): 92 mm:
Between second and third lens groups: 57 mm;
Between third and fourth lens groups: 103 mm;
Foruth group to input crossover image plane of spectrometer: 38 mm;
Fourth group to input object image plane of spectrometer: 110 mm;
Output crossover image plane of spectrometer to first lens group of second imaging means: 26 mm;
Output object image plane of spectrometer to first lens group of second imaging means: 98 mm;
First to second group of second imaging means: 54 mm.

21. A transmission electron microscope capable of producing a diffraction pattern of an object and enlarged iamges thereof throughout a range, said microscope comprising:
   (a) means for holding an object to examined in a predetermined fixed object plane;
   (b) a source of electrons providing a beam for illuminating said object; an imaging electron-energy spectrometer having a predetermined fixed input image plane and a predetermined fixed input crossover plane as well as a predetermined fixed output image plane;
   (d) first imaging means including at least four electron-optical lens groups for producing an image of the diffraction pattern of said object at said input image plane of said spectrometer and producing an image of said object at said input crossover plane of said spectrometer;
   (e) said first imaging means having a first lens group producing a first real intermediate image of said diffraction pattern and a first real intermediate image of said object;
   (f) said first imaging means having a second lens group imaging said first intermediate image of said diffraction pattern to form a second real intermediate image of said diffraction pattern and imaging said first intermediate image of said object to form a second virtual image of said object;
   (g) said first imaging means having a third lens group imaging said second intermediate image of said diffraction pattern to form a third real intermediate image of said diffraction pattern and imaging said second intermediate image of said object to form a third real intermediate image of said object;
   (h) said first imaging means further having a fourth lens group imaging said third intermediate image of said diffraction pattern to form a fourth real intermediate image of said diffraction pattern at said input image plane of said spectrometer and imaging said third intermediate image of said object to form a fourth real intermediate image of said object at said input crossover plane of said spectrometer;
   (i) current supply means connected to respective ones of said lens groups for adjusting the current supplied thereto so as to cause said first imaging means to always image said object into said input crossover plane and to always image said diffraction pattern into said iput image plane irrespective of changes in magnification within said range thereby avoiding manual refocusing of said first imaging means; and,
   (j) second imaging means arranged downstream of said spectrometer for imaging an image of said diffraction pattern in said output image plane of said spectrometer into a final image plane.

22. The invention defined in claim 21, wherein each of said four electron-optical lens group comprises one or more electron-optical lenses.

23. The invention defined in claim 21, wherein said spectrometer includes means in its dispersion plane for filtering out a selected portion of electrons from an image beam entering said spectrometer from said input image plane and delivering the filtered beam to form an image at an output image plane, said microscope further comprising:
   (k) and second imaging means producing in said final-image plane a filtered image of said diffraction pattern reproduced from said image at said output image plane of said spectrometer; and
   (l) detector means located at said final-image plane, said detector means having a limited usable area;
   (m) said second imaging means operating at substantially constant magnification, the magnification of said second imaging means being selected to accommodate the size of the image produced thereby at said final-image plane to said usable area of said detector means.

24. The invention defined in claim 21, whereby said magnification range is about 20:1.

25. The invention defined in claim 21, further comprising deflection means (44) located substantially at said input crossover point, whereby a bundle of electron beams emerging from said first imaging means is directed accurately to an input axis of said spectrometer.

26. The invention defined in claim 21, further comprising an adjustable aperture (42) arranged in the path of electron beam between said input crossover plane of said spectrometer and said input image plane of said spectrometer; said adjustable aperture diaphragm having a plurality of circular apertures of different sizes, any one of which is selectively placeable in said path of electron beams.

27. The invention defined in claim 21, wherein said spectrometer has an output crossover plane defining a dispersion plane perpendicular to the optical axis, said electron microscope further comprising a slit aperture (43) of variable width located in said dispersion plane; said slit diaphragm comprises two slit jaws (43b, 43c) movable relative to each other to vary the size of a slit between them, said jaws being insulated from each other, and means including separate electrical conductors operatively connected to the separate jaws for measuring separately the electrical conditions of each jaw.

28. The invention defined in claim 21, wherein said imaging electron-energy spectrometer (15) is a prism-mirror-prism system having a prism (20) which has non-planar entrance and exit surfaces (51, 52, 53).

29. The invention defined in claim 28, wherein said enctrance and exit surfaces of said prism are curved substantially along arcs of circles, and wherein the characteristics of said prism are substantially in accordance with the following formulas:

$$1,0 < R_1/R < 1,35$$

$$0,8 < R_2/R < 1,8$$

$$40° < \epsilon < 55°$$

$$f_1/R \geq 1.8$$

in which $R_1$ represents the radius of curvature of the initial entrance surface (51) and the final exit surface (53) of the prism, $R_2$ represents the radius of curvature of the intermediate exit and re-entrance surface (52) thereof, R represents the radius of the circular paths of rays within the prism, $f_1$ represents the input focal length of the spectrometer, and $\epsilon$ represents the angle between said axis of the electron beam entering the prism and a normal to the entrance surface at the point where the axis strikes the surface.

30. The invention defined in claim 21, said second imaging means producing in said final-image plane an image reproduced from an image at an output image plane of said spectrometer, said second imaging means having two electron-optical lens groups, the focal lengths of said lens groups and their spatial relationship to each other being substantially in accordance with the following data:

Focal lengths

First lens group of first imaging means; 2,6 to 40 mm;
Second lens group of first imaging means: 7,5 to 40 mm;
Third lens group of first imaging means: 6 to 80 mm;
Fourth lens group of first imaging means: 23 to 52 mm;
First lens group of second imaging means 18 to 44 mm;
Second lens group of second imaging means 3 to 6 mm.

Spacings

Between first and second lens group (first imaging means): 92 mm;
Between second and third lens groups: 57 mm;
Between third and fourth lens group: 103 mm;
Fourth group to input crossover image plane of spectrometer: 38 mm;
Fourth group to input object image plane of spectrometer: 110 mm;
Output crossover image plane of spectrometer to first lens group of second imaging means: 26 mm;
Output object image plane of spectrometer to first lens group of second imaging means: 98 mm;
First to second group of second imaging means: 54 mm.

* * * * *

UNITED STATES PATENT AND TRADEMARK OFFICE
CERTIFICATE OF CORRECTION

PATENT NO. : 4,812,652

DATED : March 14, 1989

INVENTOR(S) : Wilhelm Egle, F. Peter Ottensmeyer and Albrecht Rilk

It is certified that error appears in the above-identified patent and that said Letters Patent is hereby corrected as shown below:

On the title page:

In the abstract, line 16: insert -- the -- between "to" and "size".

In column 1, line 56: delete "iamges" and substitute -- images -- therefor.

In column 3, line 46: delete "image" and substitute -- imaged -- therefor.

In column 4, line 56: delete "drawngs" and substitute -- drawings -- therefor.

In column 6, line 11: delete "schromatic" and substitute -- achromatic -- therefor.

UNITED STATES PATENT AND TRADEMARK OFFICE
CERTIFICATE OF CORRECTION

PATENT NO. : 4,812,652

DATED : March 14, 1989

INVENTOR(S) : Wilhelm Egle, F. Peter Ottensmeyer and Albrecht Rilk

It is certified that error appears in the above-identified patent and that said Letters Patent is hereby corrected as shown below:

In column 6, line 37: delete "groups O" and substitute -- group O -- therefor.

In column 7, line 13: delete "front" and substitute -- first -- therefor.

In column 8, line 22: delete "age" and substitute -- ages -- therefor.

In column 8, line 51: delete "point $C_3$," and substitute -- point $C_E$, -- therefor.

In column 9, line 1: delete "if" and substitute -- it -- therefor.

UNITED STATES PATENT AND TRADEMARK OFFICE
CERTIFICATE OF CORRECTION

PATENT NO. : 4,812,652

DATED : March 14, 1989

INVENTOR(S) : Wilhelm Egle, F. Peter Ottensmeyer and Albrecht Rilk

It is certified that error appears in the above-identified patent and that said Letters Patent is hereby corrected as shown below:

In column 13, line 30: insert -- the -- before "electron".

In column 13, line 53: delete "defines" and substitute -- defined -- therefor.

In column 13, line 54: delete "enctrance" and substitute -- entrance -- therefor.

In column 15, line 29: delete "elctron-optical" and substitute -- electron-optical -- therefor.

In column 15, line 59: insert -- the -- between "of" and "electron".

UNITED STATES PATENT AND TRADEMARK OFFICE
CERTIFICATE OF CORRECTION

PATENT NO. : 4,812,652

DATED : March 14, 1989

INVENTOR(S) : Wilhelm Egle, F. Peter Ottensmeyer and Albrecht Rilk

It is certified that error appears in the above-identified patent and that said Letters Patent is hereby corrected as shown below:

In column 16, line 14: delete "enctrance" and substitute -- entrance -- therefor.

In column 16, line 60: delete "Foruth" and substitute -- Fourth -- therefor.

In column 17, line 3: delete "iamges" and substitute -- images -- therefor.

In column 17, line 5: insert -- be -- between "to" and "examined".

In column 17, lines 8 and 9, deleting "an imaging electron-energy" from column 17, line 8; and in line 9, before "spectrometer" inserting --(c) an imaging electron-energy--.

UNITED STATES PATENT AND TRADEMARK OFFICE
CERTIFICATE OF CORRECTION

PATENT NO. : 4,812,652

DATED : March 14, 1989

INVENTOR(S) : Wilhelm Egle, F. Peter Ottensmeyer and Albrecht Rilk

It is certified that error appears in the above-identified patent and that said Letters Patent is hereby corrected as shown below:

In column 17, line 67: delete "and" and substitute -- said -- therefor.

In column 18, line 21: insert -- the -- between "of" and "electron".

In column 18, line 44: delete "enctrance" and substitute -- entrance -- therefor.

In column 20, line 3: delete "group" and substitute -- groups -- therefor.

In column 20, line 6: delete "group:" and substitute -- groups: -- therefor.

Signed and Sealed this

Twenty-fourth Day of April, 1990

*Attest:*

HARRY F. MANBECK, JR.

*Attesting Officer*  *Commissioner of Patents and Trademarks*